United States Patent
Antoniswamy et al.

(10) Patent No.: US 10,236,233 B2
(45) Date of Patent: Mar. 19, 2019

(54) HEAT SPREADERS WITH INTEGRATED PREFORMS

(71) Applicant: Intel Corporation, Santa Clara, CA (US)

(72) Inventors: Aravindha R. Antoniswamy, Phoenix, AZ (US); Thomas J. Fitzgerald, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/711,435

(22) Filed: Sep. 21, 2017

(65) Prior Publication Data

US 2018/0012820 A1    Jan. 11, 2018

Related U.S. Application Data

(62) Division of application No. 14/942,281, filed on Nov. 16, 2015, now Pat. No. 9,799,584.

(51) Int. Cl.
*H01L 23/00* (2006.01)
*H01L 23/367* (2006.01)
(Continued)

(52) U.S. Cl.
CPC .......... *H01L 23/3675* (2013.01); *B22D 19/00* (2013.01); *B22D 19/04* (2013.01);
(Continued)

(58) Field of Classification Search
CPC .................................................. H01L 23/3675
See application file for complete search history.

(56) References Cited

U.S. PATENT DOCUMENTS

| 2002/0079613 A1* | 6/2002 | Benefield ................. B22F 7/06 264/255 |
| 2006/0086118 A1 | 4/2006 | Venkatasubramanian et al. |

(Continued)

FOREIGN PATENT DOCUMENTS

| KR | 1020130071812 | 7/2013 |
| KR | 1020150073026 | 6/2015 |
| WO | 2017087065 A1 | 5/2017 |

OTHER PUBLICATIONS

Ifixit, Amazon Fire TV Teardown, Oct. 14, 2015 [on line]; https://www.ifixit.com/Teardown/Amazon+Fire+TV=Teardown/23856; 14 pages.

(Continued)

*Primary Examiner* — William Harriston
(74) *Attorney, Agent, or Firm* — Patent Capital Group

(57) ABSTRACT

Embodiments of heat spreaders with integrated preforms, and related devices and methods, are disclosed herein. In some embodiments, a heat spreader may include: a frame formed of a metal material, wherein the metal material is a zinc alloy or an aluminum alloy; a preform secured in the frame, wherein the preform has a thermal conductivity higher than a thermal conductivity of the metal material; and a recess having at least one sidewall formed by the frame. The metal material may have an equiaxed grain structure. In some embodiments, the equiaxed grain structure may be formed by squeeze-casting or rheocasting the metal material.

20 Claims, 11 Drawing Sheets

(51) Int. Cl.
*B22D 19/00* (2006.01)
*B22D 31/00* (2006.01)
*B23K 26/362* (2014.01)
*F28F 21/00* (2006.01)
*H01L 21/48* (2006.01)
*H01L 23/373* (2006.01)
*F28F 3/02* (2006.01)
*F28F 21/08* (2006.01)
*B22D 19/04* (2006.01)

(52) U.S. Cl.
CPC ............ *B22D 31/00* (2013.01); *B23K 26/362* (2013.01); *F28F 3/02* (2013.01); *F28F 21/00* (2013.01); *F28F 21/08* (2013.01); *H01L 21/4882* (2013.01); *H01L 23/3732* (2013.01); *H01L 24/83* (2013.01); *H01L 23/3731* (2013.01); *H01L 23/3736* (2013.01)

(56) References Cited

U.S. PATENT DOCUMENTS

| | | |
|---|---|---|
| 2010/0064518 A1 | 3/2010 | Lower et al. |
| 2010/0175851 A1 | 7/2010 | Heydari et al. |
| 2014/0002989 A1 | 1/2014 | Ahuja et al. |
| 2017/0141008 A1 | 5/2017 | Antoniswamy et al. |

OTHER PUBLICATIONS

International Search Report and Written Opinion dated Dec. 19, 2016 in PCT Application No. PCT/US2016/052399; 8 pages.

\* cited by examiner

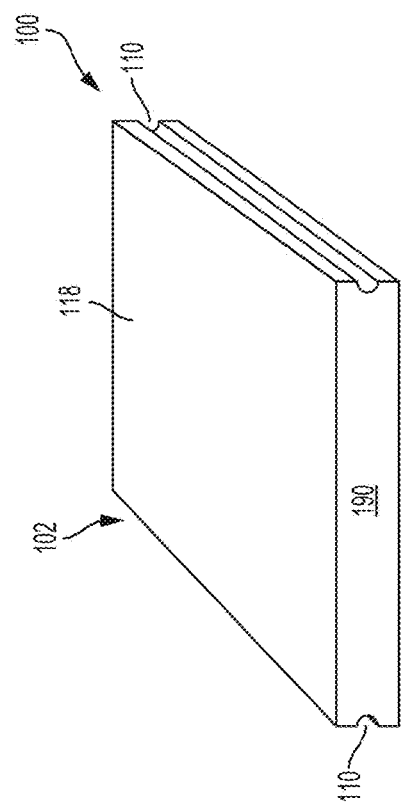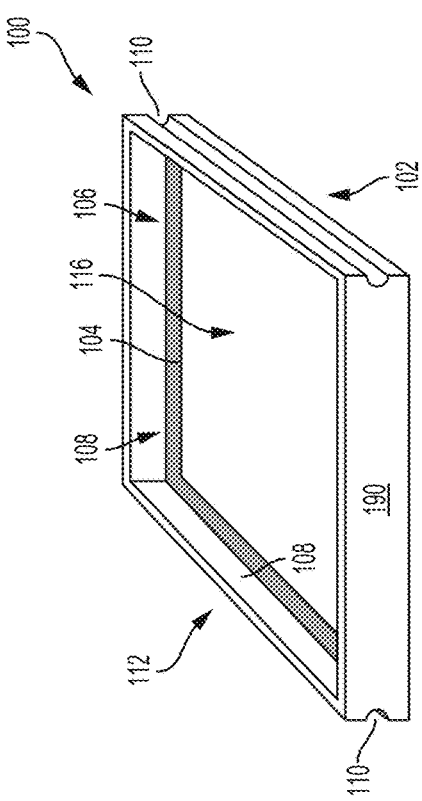

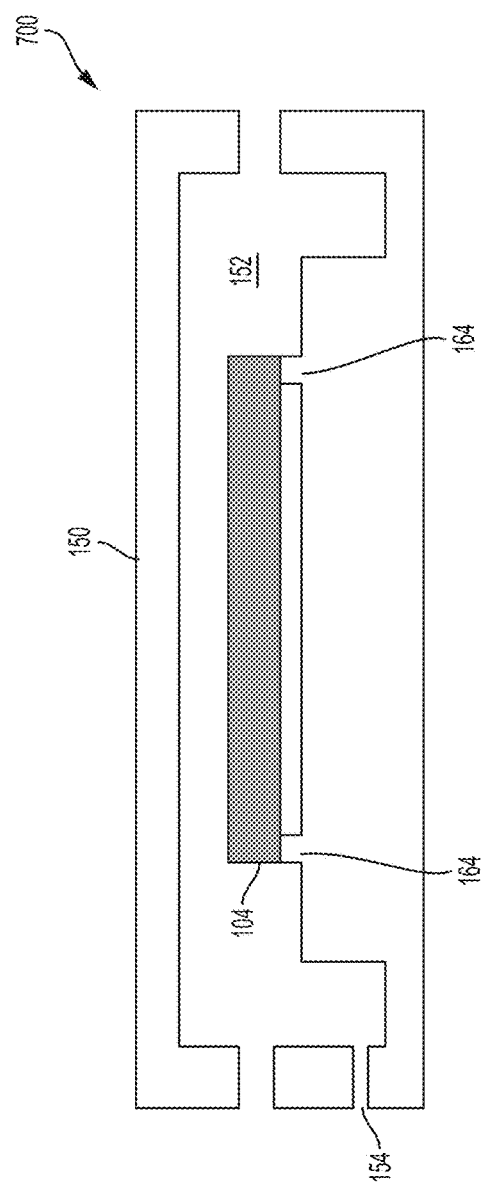
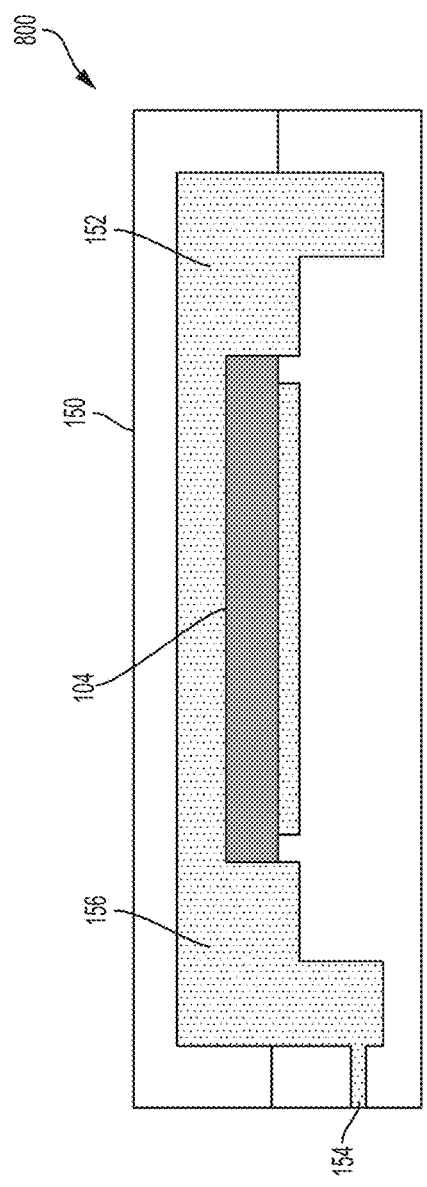

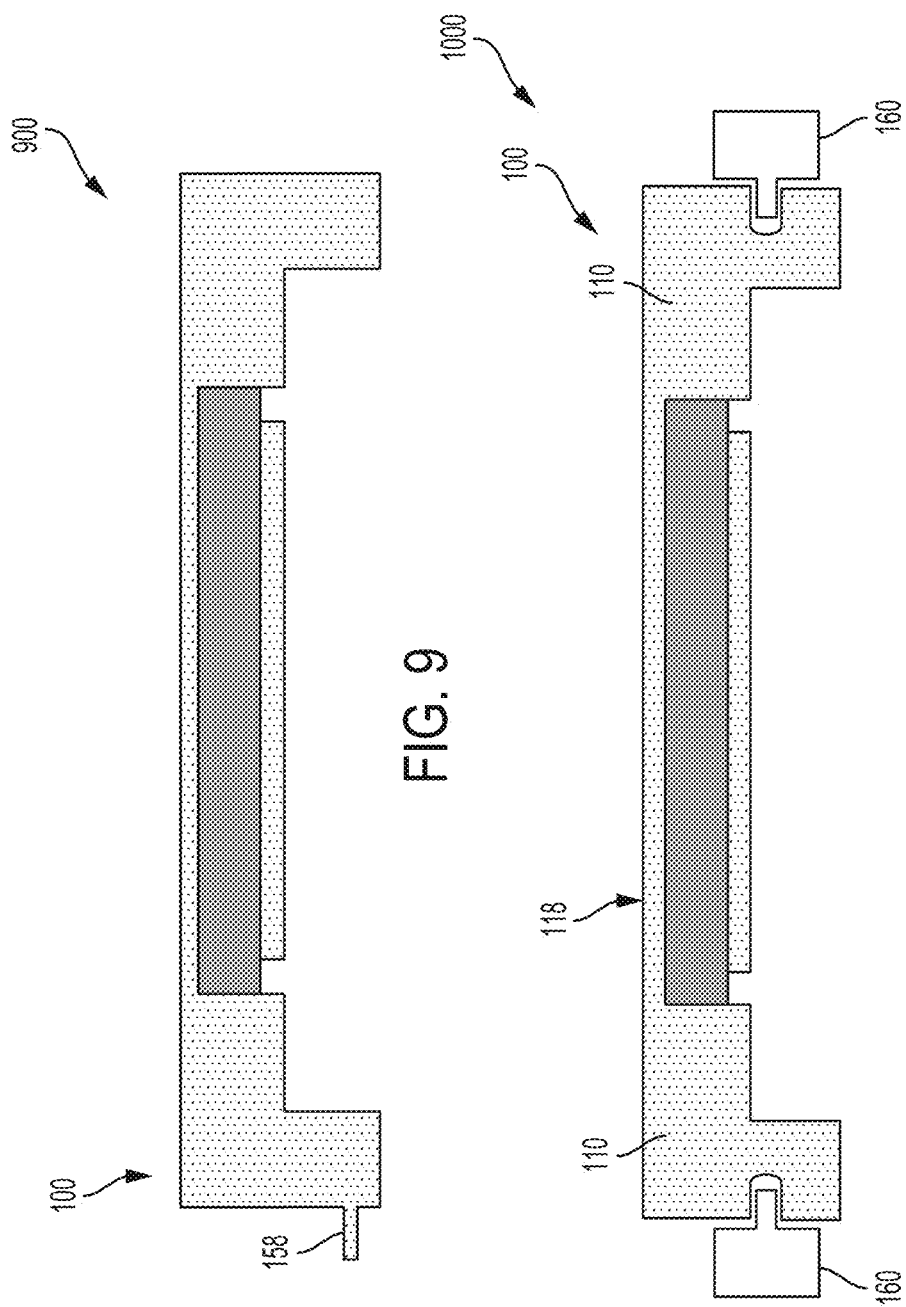

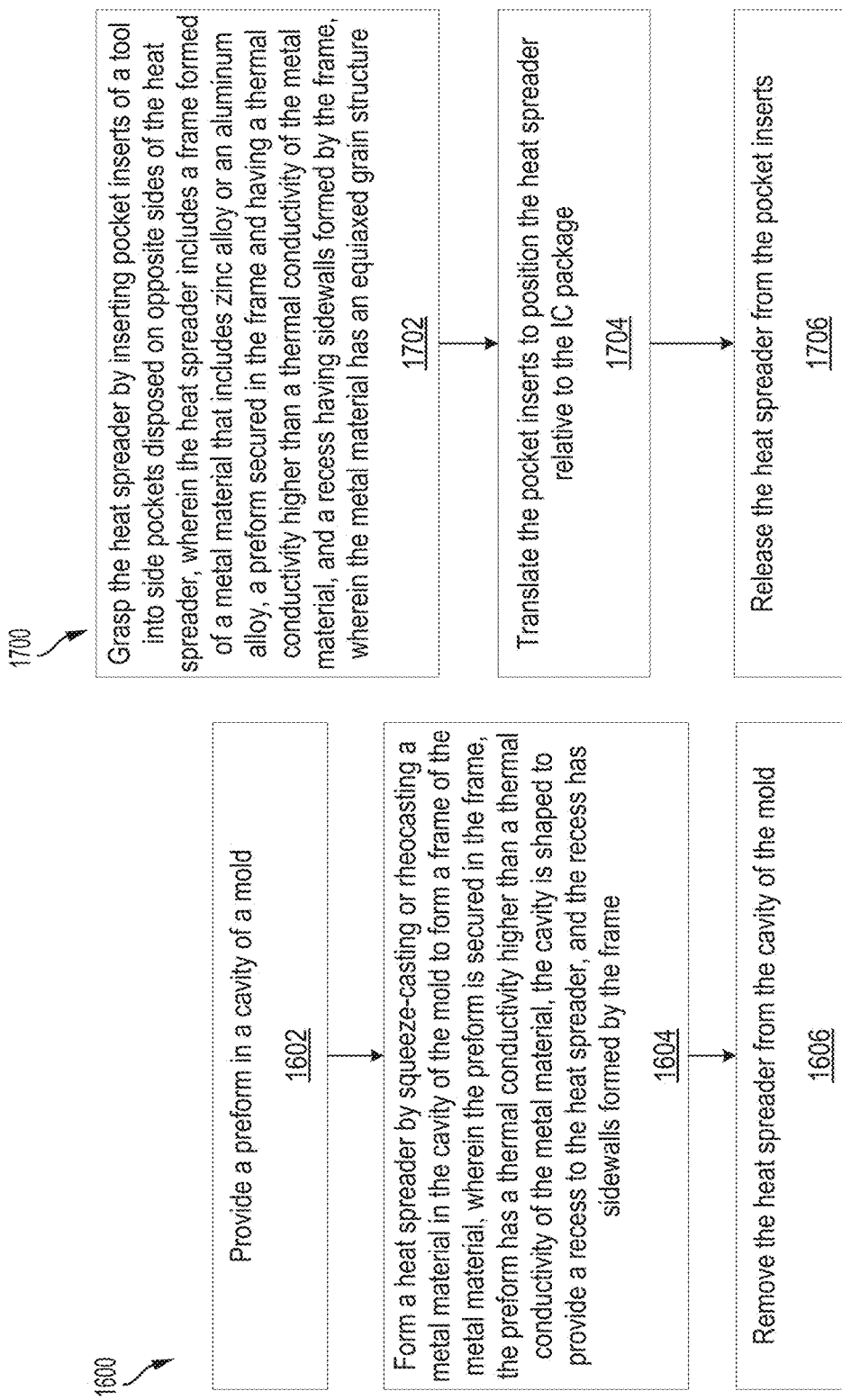

HEAT SPREADERS WITH INTEGRATED PREFORMS

CROSS-REFERENCE TO PREVIOUS APPLICATION

This application claims priority to U.S. patent application Ser. No. 14/942,281, filed Nov. 16, 2015 and titled "HEAT SPREADERS WITH INTEGRATED PREFORMS." This priority application is incorporated herein in its entirety.

TECHNICAL FIELD

The present disclosure relates generally to the field of thermal management and, more particularly, to heat spreaders with integrated preforms.

BACKGROUND

Heat spreaders may be used to move heat away from an active electronic component so that it can be more readily dissipated by a heat sink or other thermal management device. Heat spreaders are conventionally stamped from copper and have a nickel coating.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 is a top perspective view of the example heat spreader of FIG. 1, in accordance with various embodiments.

FIG. 3 is a bottom perspective view of the example heat spreader of FIG. 1, in accordance with various embodiments.

FIGS. 7-10 illustrate various stages in the manufacture of the example heat spreader of FIG. 1, in accordance with various embodiments.

FIG. 16 is a flow diagram of a method of manufacturing a heat spreader, in accordance with various embodiments.

FIG. 17 is a flow diagram of a method of positioning a heat spreader relative to an IC package, in accordance with various embodiments.

DETAILED DESCRIPTION

Figure 1:
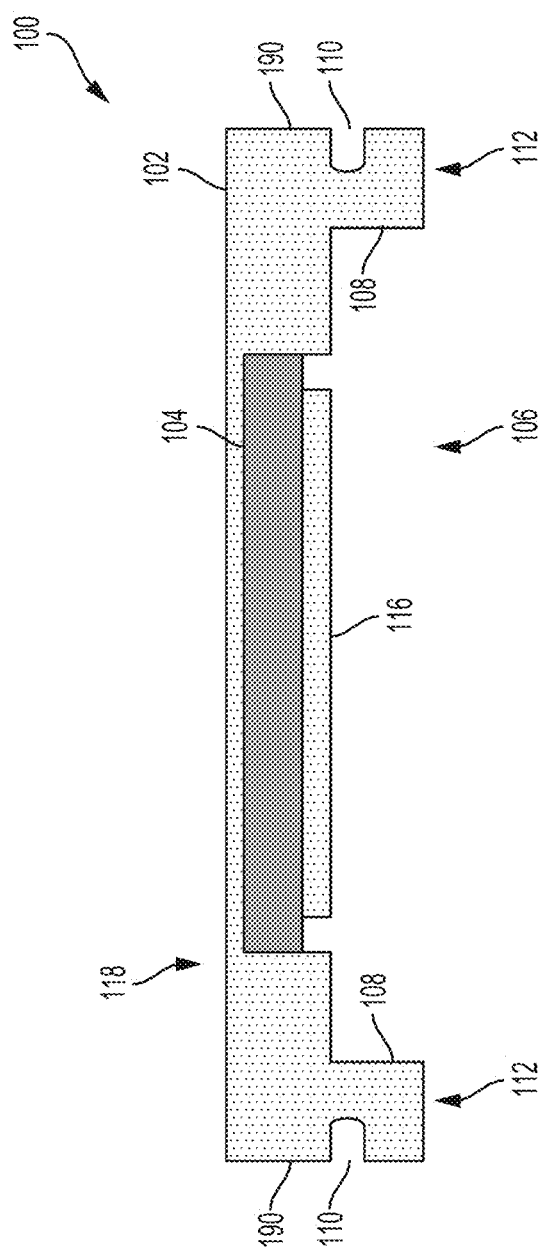
FIG. 1 is a side cross-sectional view of an example heat spreader, in accordance with various embodiments.

Disclosed herein are embodiments of heat spreaders with integrated preforms and related devices and methods. In some embodiments, a heat spreader may include: a frame formed of a metal material, wherein the metal material includes a zinc alloy or an aluminum alloy; a preform secured in the frame, wherein the preform has a thermal conductivity higher than a thermal conductivity of the metal material; and a recess having at least one sidewall formed by the frame. The metal material may have an equiaxed grain structure and may be, for example, a zinc or aluminum alloy, and the preform may be formed from boron nitride or another suitable material. In some embodiments, the equiaxed grain structure may be formed by squeeze casting or rheocasting the metal material.

Various ones of the embodiments disclosed herein may provide improved thermal management for complex computing device designs, such as those involving multiple integrated circuit (IC) packages of different heights and footprints distributed on a circuit board. Such complex computing device designs may arise in large computing server applications, "patch/package on interposer" configurations, and "package on package" configurations, among others. Additionally, various ones of the embodiments disclosed herein may be beneficially applied in computing tablets in which it may be advantageous to dissipate heat from computing components in the tablet both in the direction normal to the plane of the tablet and within the plane of the tablet. Various ones of the embodiments disclosed herein may include innovative material combinations, manufacturing techniques, and geometrical features.

Conventional techniques for forming heat spreaders typically involve stamping the heat spreader from a sheet of copper material. However, as IC packages grow and become more powerful, larger and thicker heat spreaders with more complex geometries may be desired. For example, it may be useful to have a heat spreader that is capable of moving heat from multiple silicon die of varying heights. However, the multi-hundred ton presses required for stamping such heat spreaders are prohibitively large and expensive for practical use, and may not even be capable of forming the desired geometries. Additionally, conventional stamping techniques are limited by the conventional practical maximum thickness of the copper sheet used during stamping. This copper sheet is typically provided on a roll and can only be wound so tightly before the copper begins to undesirably deform. Conventional techniques have been limited to copper sheets that are 3.2 mm thick or less, which limits the thickness of the heat spreader that can be formed from such sheets to 3.2 mm or less.

Additionally, the thermal management needs of a computing device may not require a heat spreader to be formed entirely from copper; for example, less heat may need to be dissipated at the edges of a large heat spreader than in the portions of the heat spreader closer to active dies. Because stamping a heat spreader from a copper sheet results in a heat spreader that is entirely formed from copper, and because copper is an expensive material, traditional stamping techniques may be both expensive and materially wasteful for some applications.

The use of stamping to form heat spreaders can also reduce the thermal and mechanical performance of a heat spreader, especially for complex geometries that require high tonnage presses. In particular, the regions of the heat spreader that undergo very high deformation (such as the sidewalls of recesses in a heat spreader) are prone to recrystallize during surface mount reflow because of the stored plastic energy imparted to the material during stamping. Upon recrystallization, the strength of the heat spreader drops dramatically, and the heat spreader may warp or break.

Use of various ones of the embodiments disclosed herein may enable formation of heat spreaders with complex geometry at relatively low cost. This may allow powerful processing packages (e.g., central processing unit packages) with supporting memory chips to be cooled with a single large heat spreader. This may reduce cost overall and improve functionality, making new computing device designs (e.g., server designs) possible. Various ones of the materials disclosed herein (e.g., boron nitride) may provide more effective silicon cooling than conventional copper heat spreaders. This may provide an overall improvement in the performance of computing devices that utilize the heat spreaders disclosed herein, as cooler processors typically use less electricity and have improved reliability.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Although various elements may be provided with different reference numerals in one or more of the accompanying cross-sectional drawings, these elements may be coupled outside of the plane of the cross section, or they may be separate.

FIG. 1 is a side cross-sectional view of an example heat spreader 100, in accordance with various embodiments. The heat spreader 100 of FIG. 1 may include a frame 102 including a metal material (e.g., formed entirely or partially of the metal material) and a recess 106 having sidewalls 108 formed by the frame 102. In some embodiments, the metal material may be a zinc alloy or an aluminum alloy. Zinc alloys and aluminum alloys may advantageously have relatively low melting temperatures (under 700 degrees Celsius), enabling them to be cast into complex geometrical arrangements without requiring expensive and difficult high casting techniques, as would be required by metals having high melting temperatures (such as copper). Zinc alloys and aluminum alloys may also be advantageously inexpensive relative to conventional copper.

A preform 104 may be secured in the frame 102. The preform 104 may have a thermal conductivity that is higher than a thermal conductivity of the metal material of the frame 102. In some embodiments, the preform 104 may be formed of boron nitride (e.g., pre-sintered boron nitride). Boron nitride is a ceramic that has been conventionally used as an industrial abrasive and, on its own, is unlikely to withstand the forces experienced by the heat spreader 100 during use (e.g., sudden shocks from drops and forces and temperature changes experienced during assembly). However, when secured in the frame 102 in accordance with the present disclosure, the mechanical weakness of boron nitride may be mitigated by the protection provided by the frame 102, and the high thermal conductivity (and low cost) of boron nitride may be exploited for thermal management. Embodiments in which the preform is formed of boron nitride and the frame 102 is formed of aluminum alloy may take advantage of the good wettability between boron nitride and aluminum. In some embodiments, the preform 104 may be formed of pre-sintered cubic boron nitride (having a thermal conductivity of 700 W/m/K). In some embodiments, the preform 104 may be formed of pre-sintered hexagonal boron nitride (having a thermal conductivity of 600 W/m/K in a direction parallel to the basal planes of the material, and 30 W/m/K in a direction perpendicular to the basal planes).

In some embodiments, the preform 104 may be formed of a material other than boron nitride, such as a synthetic diamond (formed by, e.g., chemical vapor deposition or plasma vapor deposition) or aluminum nitride. If copper were used for the preform 104, care would have to be taken with the interface between the preform 104 and the frame 102, since zinc and copper (or aluminum and copper) are electrochemically reactive and thus are likely to corrode or otherwise decrease the reliability of the computing device in which the heat spreader 100 is used. By contrast, boron nitride is a non-conductor, and thus will not corrode. The selection of an appropriate material for the preform 104 may depend on the selection of the material for the frame 102; for improved heat transfer, as noted above, it is desirable for the preform 104 to have a thermal conductivity that is higher than a thermal conductivity of the frame 102.

Although the preform 104 illustrated in FIG. 1 has a rectangular cross-section, this need not be the case, and the preform 104 may have any desired cross-section or footprint. In some embodiments, the shape of the preform 104 may be selected to achieve a desired thermal distribution. For example, the preform 104 may have a trapezoidal cross-section, with the shorter parallel side of the trapezoid positioned closer to the recess bottom outer surface 116 and the longer parallel side of the trapezoid positioned closer to the top outer surface 118. In such an embodiment, heat absorbed by the area of the preform 104 corresponding to the shorter parallel side of the trapezoid may be transmitted through the preform 104 and distributed over the larger area of the preform 104 corresponding to the larger parallel side of the trapezoid. The shape of the preform 104 may also be selected based on the material properties of the preform 104. For example, as discussed below with reference to FIG. 5, the preform 104 may not be shaped as a rectangular solid, and may have at least one face parallel to the majority orientation of basal planes in the pre-sintered hexagonal boron nitride.

The heat spreader 100 of FIG. 1 may include a side pocket 110 formed in the frame 102 (e.g., in the side outer surface 190 of the heat spreader 100 as shown). In particular, FIG. 1 depicts an embodiment in which the frame 102 includes a projection 112, and the sidewall 108 and the side pocket 110 are disposed on opposite faces of the projection 112. In FIG. 1, the side pockets 110 are shown "below" a plane of the preform 104, but in other embodiments, the side pockets 110 may be substantially within a plane of the preform 104, or "above" a plane of the preform 104. FIG. 2 is a top perspective view of the heat spreader 100 of FIG. 1, and depicts side pockets 110 disposed on only two faces of the side outer surface 190 of the heat spreader 100. This is simply illustrative, and side pockets 110 may be included on two or more faces of the side outer surface 190 of the heat spreader 100. In some embodiments, the heat spreader 100 may include no side pockets 110.

As illustrated in FIGS. 1 and 2, the frame 102 of the heat spreader 100 may provide the top outer surface 118 of the heat spreader 100. In other words, the preform 104 may not be exposed on the top outer surface 118. Having the top outer surface 118 of the heat spreader 100 present a uniform material appearance, and a flat surface, may reduce the likelihood that test tools will scratch or get stuck on any non-uniformities, at the cost of some reduction in the heat dissipation ability of the heat spreader 100 (since the thermal conductivity of the frame 102 is lower than the thermal conductivity of the preform 104). This cost may be reduced by only having a thin layer of the metal material of the frame 102 at the top outer surface 118 of the heat spreader 100. However, as illustrated in FIGS. 1 and 3 (the latter providing a bottom perspective view of the heat spreader 100 of FIG. 1), the preform 104 may be exposed at the recess bottom outer surface 116 of the heat spreader 100. Since the recess bottom outer surface 116 of the heat spreader 100 will face an IC package during use, rather than facing "outside," having the preform 104 exposed at the recess bottom outer surface 116 may not raise the potential processing concerns discussed above with reference to the top outer surface 118. In other embodiments, the preform 104 may not be exposed at any outer surface and may instead be enclosed within the frame 102. In still other embodiments, the preform 104 may not be exposed at any outer surface and may instead be enclosed by a combination of the frame 102 and a coating material provided to the heat spreader 100 to cover any otherwise exposed surfaces of the preform 104. For example, a coating material may be provided to cover the exposed portions of the preform 104 at the recess bottom outer surface 116. A coating material may be, for example, a thermally conductive epoxy or a metallic coating. A coating material may mitigate the risk of fracture, chip-off, or contamination of exposed portions of the preform 104 in some embodiments; in other embodiments, no coating material may be included.

Although FIGS. 2 and 3 show the heat spreader 100 of FIG. 1 as having a substantially rectangular footprint, this need not be the case, and the heat spreader 100 of FIG. 1 (and any other heat spreaders disclosed herein) may have footprints of any desired shape.

Figure 15:
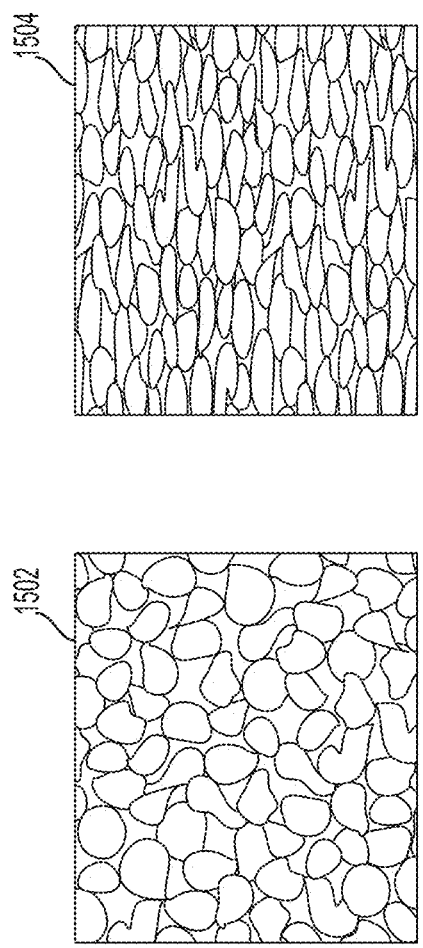
FIG. 15 depicts an example of an equiaxed grain structure and an example of an elongated grain structure, in accordance with various embodiments.

The metal material of the frame 102 may have an equiaxed grain structure. As used herein, an "equiaxed grain structure" may refer to a grain structure in which the axes of the grains in the material have approximately the same length and may be contrasted with an "elongated grain structure" in which the axes of the grains in the material do not have approximately the same length (and thus appear "elongated"). FIG. 15 depicts an example 1502 of an equiaxed grain structure and an example 1504 of an elongated grain structure, in accordance with various embodiments. It is important to note that the examples of FIG. 15 are simplified illustrations, and thus the particular appearance of the grain structure of different materials will vary. As understood in the art, elongated grain structures often result from manufacturing techniques that mechanically stretch, compress, or otherwise deform a material. An example of a manufacturing technique that often results in elongated grain structures (particularly in the vicinity of corners and other geometric features of a formed material) is stamping, in which a sheet or block of material is deformed using a press to adopt a desired shape.

Other manufacturing techniques may allow the formation of corners and other geometric features in a formed material while maintaining an equiaxed grain structure in the formed material. One of the techniques that may be used to form the frame 102 so as to achieve an equiaxed grain structure of the metal material is squeeze casting. As known in the art, squeeze casting is a process in which a fluid material (e.g., the metal material) is provided to a bottom half of a mold, and the fluid material is squeezed into its final form as the top half of the mold is brought into contact with, displaces, and applies pressure to the fluid material. Another technique that may be used to form the frame 102 so as to achieve an equiaxed grain structure of the metal material is rheocasting. As known in the art, rheocasting is a process in which a semisolid slurry (e.g., of the metal material) is cast in a mold.

Squeeze-casting or rheocasting the frame 102 around the preform 104 may enable the frame 102 to be formed with lower porosity (generally associated with improved thermal performance), lower shrinkage, and tighter tolerances than achievable with traditional mold casting. Additionally, squeeze casting and rheocasting may be used to form complex geometric features that would require presses of enormous size to stamp (e.g., greater than 300 tons is even possible). Such presses are nearly unobtainable in practice and thus have represented a limit on the kinds of features a stamped heat spreader can include. Squeeze casting and rheocasting, however, may enable the formation of geometric features in the heat spreader 100 that could not previously be manufactured, with tolerances the material properties not previously achievable. Example techniques for manufacturing the heat spreader 100 of FIG. 1 are discussed below with reference to FIGS. 7-11.

In use, the heat spreader 100 of FIG. 1 may be arranged in a computing device such that one or more integrated circuit (IC) packages 176 (not shown in FIG. 1) are disposed in the recess 106 and in thermal contact with the recess bottom outer surface 116. The heat spreader 100 may be secured to a substrate to which the IC package 176 is secured (e.g., a circuit board). Various examples of arrangements of heat spreaders 100 and IC packages 176 disposed within their recesses 106 are discussed below with reference to FIG. 6.

Figure 4:
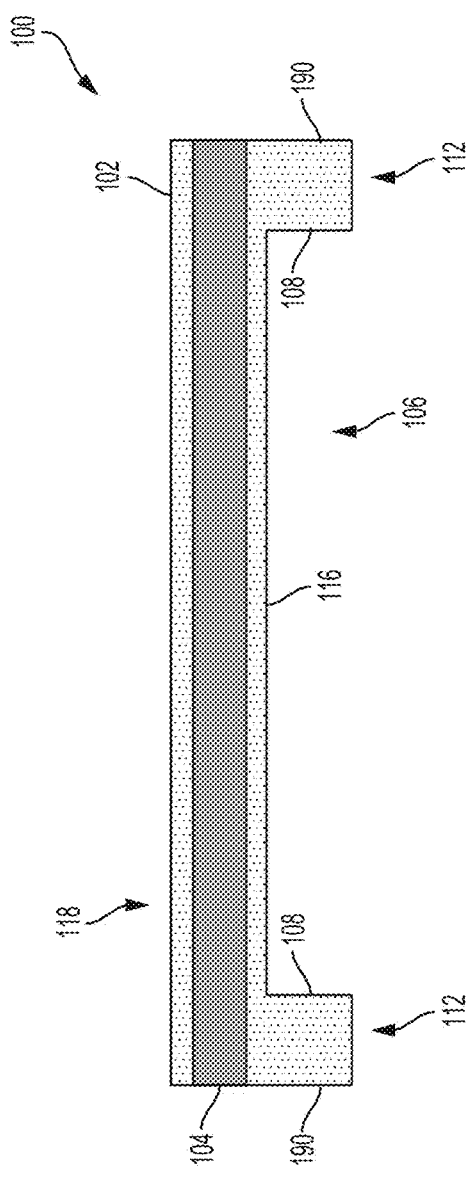
FIG. 4 is a side cross-sectional view of another example heat spreader, in accordance with various embodiments.

FIG. 4 is a side cross-sectional view of another example heat spreader 100, in accordance with various embodiments. The heat spreader 100 of FIG. 4 may include a frame 102 formed of a metal material and a preform 104 secured in the frame 102. The metal material of the frame 102 may have an equiaxed grain structure, and the preform 104 may have a thermal conductivity higher than a thermal conductivity of the metal material of the frame 102. The metal material of the frame 102 of the heat spreader 100 of FIG. 4 may take any of the forms discussed above with reference to the metal material of the frame 102 of the heat spreader 100 of FIG. 1, and the preform 104 of the heat spreader 100 of FIG. 4 may take any of the forms discussed herein with reference to the preform 104 of the heat spreader 100 of FIGS. 1 and 5. For example, in some embodiments, the metal material may be a zinc alloy or an aluminum alloy, and the preform 104 may be formed of boron nitride or synthetic diamond. The footprint and perspective arrangement of the heat spreader 100 of FIG. 4 may take any of the forms discussed above with reference to the heat spreader 100 of FIGS. 2-3.

The heat spreader 100 of FIG. 4 may include a recess 106 having at least one sidewall 108 formed by the frame 102. In particular, the frame 102 may include a projection 112 forming the sidewalls 108. Although no side pockets 110 are illustrated in FIG. 4, the heat spreader 100 of FIG. 4 may include side pockets 110.

As illustrated in FIG. 4, the frame 102 of the heat spreader 100 may provide the top outer surface 118 of the heat spreader 100. In other words, the preform 104 may not be exposed on the top outer surface 118. Also, the frame 102 of the heat spreader 100 of FIG. 4 may provide the recess bottom outer surface 116, and thus the preform 104 may not be exposed on the recess bottom outer surface 116. The preform 104 of the heat spreader 100 of FIG. 4 may extend through the heat spreader 100 parallel to the top outer surface 118 all the way to the side outer surface 190. In particular, the preform 104 of the heat spreader 100 of FIG. 4 may be disposed at least partially between the projection 112 and the top outer surface 118. As illustrated in FIG. 4, in some embodiments, the preform 104 of the heat spreader 100 of FIG. 4 may be exposed at the side outer surface 190. In other embodiments, the preform 104 of the heat spreader 100 of FIG. 4 may be covered at the side outer surface 190 (e.g., by a coating material, as discussed above with reference to FIG. 1) and/or may be enclosed within the frame 102.

In use, the heat spreader 100 of FIG. 4 may be arranged in a computing device such that one or more IC packages 176 (not shown in FIG. 4) are disposed in the recess 106 and in thermal contact with the recess bottom outer surface 116. The heat spreader 100 may be secured to a substrate to which the IC package 176 is secured (e.g., a circuit board). Various examples of arrangements of heat spreaders 100 and IC packages 176 disposed within their recesses 106 are discussed below with reference to FIG. 6.

Figure 5:
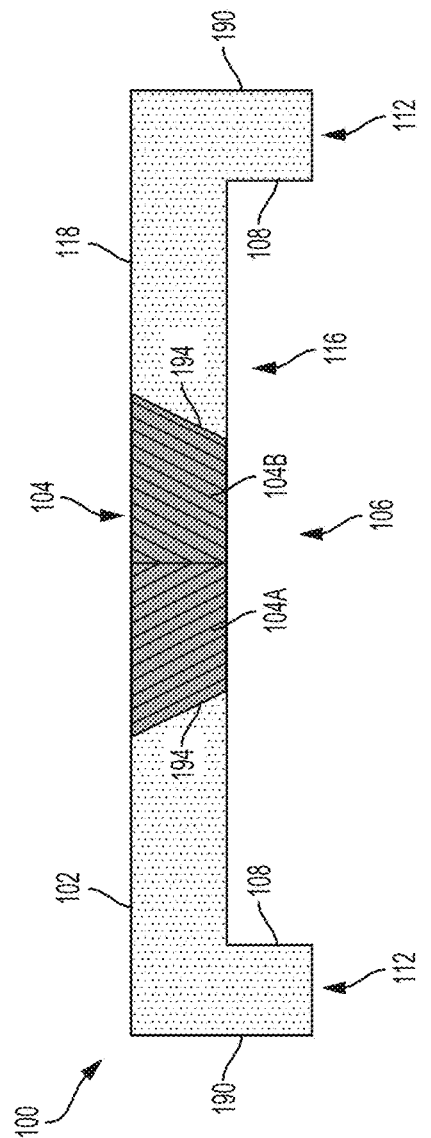
FIG. 5 is a side cross-sectional view of another example heat spreader, in accordance with various embodiments.

FIG. 5 is a side cross-sectional view of another example heat spreader 100, in accordance with various embodiments. The heat spreader 100 of FIG. 5 may include a frame 102 formed of a metal material and a preform 104 secured in the frame 102. The metal material of the frame 102 may have an equiaxed grain structure, and the preform 104 may have a thermal conductivity higher than a thermal conductivity of the metal material of the frame 102. The metal material of the frame 102 of the heat spreader 100 of FIG. 5 may take any of the forms discussed above with reference to the metal material of the frame 102 of the heat spreader 100 of FIG. 1. For example, in some embodiments, the metal material may be a zinc alloy or an aluminum alloy. The heat spreader 100 of FIG. 5 may include a recess 106 having at least one sidewall 108 formed by the frame 102. In particular, the frame 102 may include a projection 112 forming the sidewalls 108. Although no side pockets 110 are illustrated in FIG. 5, the heat spreader 100 of FIG. 5 may include side pockets 110. The footprint and perspective arrangement of the heat spreader 100 of FIG. 5 may take any of the forms discussed above with reference to the heat spreader 100 of FIGS. 2-3.

As shown in FIG. 5, the preform 104 may have a substantially trapezoidal cross-section. In particular, the preform 104 of the heat spreader 100 of FIG. 5 may be formed of a material having an anisotropic thermal conductivity and may include a first preform region 104A and a second preform region 104B. The first preform region 104A and the second preform region 104B may each have a face 194 that is parallel to a direction in which the anisotropic material of the preform 104 has its highest thermal conductivity (with the direction indicated by the diagonal lines in FIG. 5).

In some embodiments, the first preform region 104A and the second preform region 104B may each have a face 194 that is parallel to the majority orientation of basal planes of the material of the first preform region 104A and the second preform region 104B (indicated by the diagonal lines). For example, when the preform 104 is formed of hexagonal boron nitride, the face 194 may be parallel to the majority orientation of basal planes of individual grains or crystals in the hexagonal boron nitride. The majority orientation of basal planes of the first preform region 104A may be horizontally symmetric with respect to the majority orientation of basal planes of the second preform region 104B, as illustrated in FIG. 5.

The heat spreader 100 of FIG. 5 may advantageously extract heat from the smaller surface area corresponding to the face of the preform 104 closest to the recess bottom outer surface 116, transmit it through the bulk of the preform 104 in the direction of greatest thermal conductivity, and distribute it to the larger surface area corresponding to the face of the preform 104 closest to the top outer surface 118. This may improve the rate at which heat can be extracted from an electronic component in the recess 106 (e.g., as discussed below with reference to FIG. 6). Additionally, this directional heat transfer allows heat to be both transferred in the direction normal to the top outer surface 118 and in the direction parallel to the top outer surface 118. For handheld, thin form factor devices (such as tablets and mobile devices), this may prevent the formation of localized hotspots in the area just above an active IC package. Such embodiments may thus be particularly advantageous over conventional, isotropic heat spreader designs.

In some embodiments, an additional thermally conductive material may be disposed adjacent to the preform 104 at the face of the preform 104 closest to the top outer surface 118 to further improve heat extraction (e.g., a block of copper). Although only two preform regions (104A and 104B) are illustrated in FIG. 5, the preform 104 may include any number of regions oriented in any desired manner to achieve efficient heat removal when the material of the preform 104 has an anisotropic thermal conductivity.

As illustrated in FIG. 5, the preform 104 may be exposed at the top outer surface 118 and at the recess bottom outer surface 116. In other embodiments, the preform 104 of the heat spreader 100 of FIG. 5 may be covered at the top outer surface 118 and/or the recess bottom outer surface 116 (e.g., by a coating material, as discussed above with reference to FIG. 1) and/or may be enclosed within the frame 102.

In use, the heat spreader 100 of FIG. 5 may be arranged in a computing device such that one or more IC packages 176 (not shown in FIG. 5) are disposed in the recess 106 and in thermal contact with the recess bottom outer surface 116. The heat spreader 100 may be secured to a substrate to which the IC package 176 is secured (e.g., a circuit board).

Various examples of arrangements of heat spreaders 100 and IC packages 176 disposed within their recesses 106 are discussed below with reference to FIG. 6.

Any of the embodiments and features of the embodiments of the heat spreader 100 discussed above with reference to FIGS. 1-5 may be combined in any suitable manner in the design of a heat spreader in accordance with the present disclosure. For example, a preform 104 may include anisotropic thermally conductive regions (e.g., as discussed above with reference to the first preform region 104A and the second preform region 104B of FIG. 5) and isotropic thermally conductive regions. For example, a heat spreader 100 may include the first preform region 104A and the second preform region 104B of FIG. 5 with a rectangular solid block of isotropic preform material disposed between the regions. Any of the embodiments of the heat spreader 100 discussed above with reference to FIGS. 1-5 may or may not include pockets, may or may not have a preform 104 enclosed within the frame 102, and may or may not have the preform 104 exposed at any outer surfaces of the heat spreader 100.

A heat spreader 100 may include multiple recesses 106 and/or multiple preforms 104. For example, FIG. 6 is an exploded side cross-sectional view of an example heat spreader 100 positioned above multiple IC packages 176 in a computing device 600, in accordance with various embodiments. The heat spreader 100 of FIG. 6 may include a frame 102 formed of a metal material having an equiaxed grain structure and may take any of the forms discussed above with reference to the metal material of the frame 102 of the heat spreader 100 of FIG. 1. For example, in some embodiments, the metal material may be a zinc alloy or an aluminum alloy.

The heat spreader 100 may include a recess 106-1 having a recess bottom outer surface 116-1 and sidewalls 108-1, a recess 106-2 (adjacent to the recess 106-1) having a recess bottom outer surface 116-2 and sidewalls 108-2, and a recess 106-3 (adjacent to the recess 106-2) having a recess bottom outer surface 116-3 and sidewalls 108-3. A projection 112-1 may define the sidewalls 108-2, while the projection 112-1 and the projection 112-2 may define the sidewalls 108-1 and 108-3, as shown. The heat spreader 100 of FIG. 6 may include a side pocket 110 disposed in the projection 112-2.

In some embodiments of heat spreaders 100 having multiple recesses 106, the depths of different ones of the recesses 106 may be different. For example, in the heat spreader 100 of FIG. 6, the recess 106-2 may have a depth 179, while the recesses 106-1 and 106-3 may have a smaller depth 181. In other embodiments of heat spreaders 100 having multiple recesses 106, the depths of different ones of the recesses 106 may be the same.

The heat spreader 100 may include a preform 104-1 disposed proximate to the recess 106-1; preforms 104-2, 104-3, and 104-4 disposed proximate to the recess 106-2, and a preform 104-5 disposed proximate to the recess 106-3. These preforms 104 may be secured in the frame 102, and may each have thermal conductivities higher than a thermal conductivity of the metal material of the frame 102. The preforms 104 of the heat spreader 100 of FIG. 6 may take any of the forms discussed above with reference to the preforms 104 of FIGS. 1-5. For example, in some embodiments, the preform 104 may be formed of boron nitride or synthetic diamond. Different ones of the preforms 104 in the heat spreader 100 of FIG. 6 may be formed of different materials and/or may have different geometries (e.g., any of the geometries discussed above with reference to FIGS. 1-5).

Figure 6:
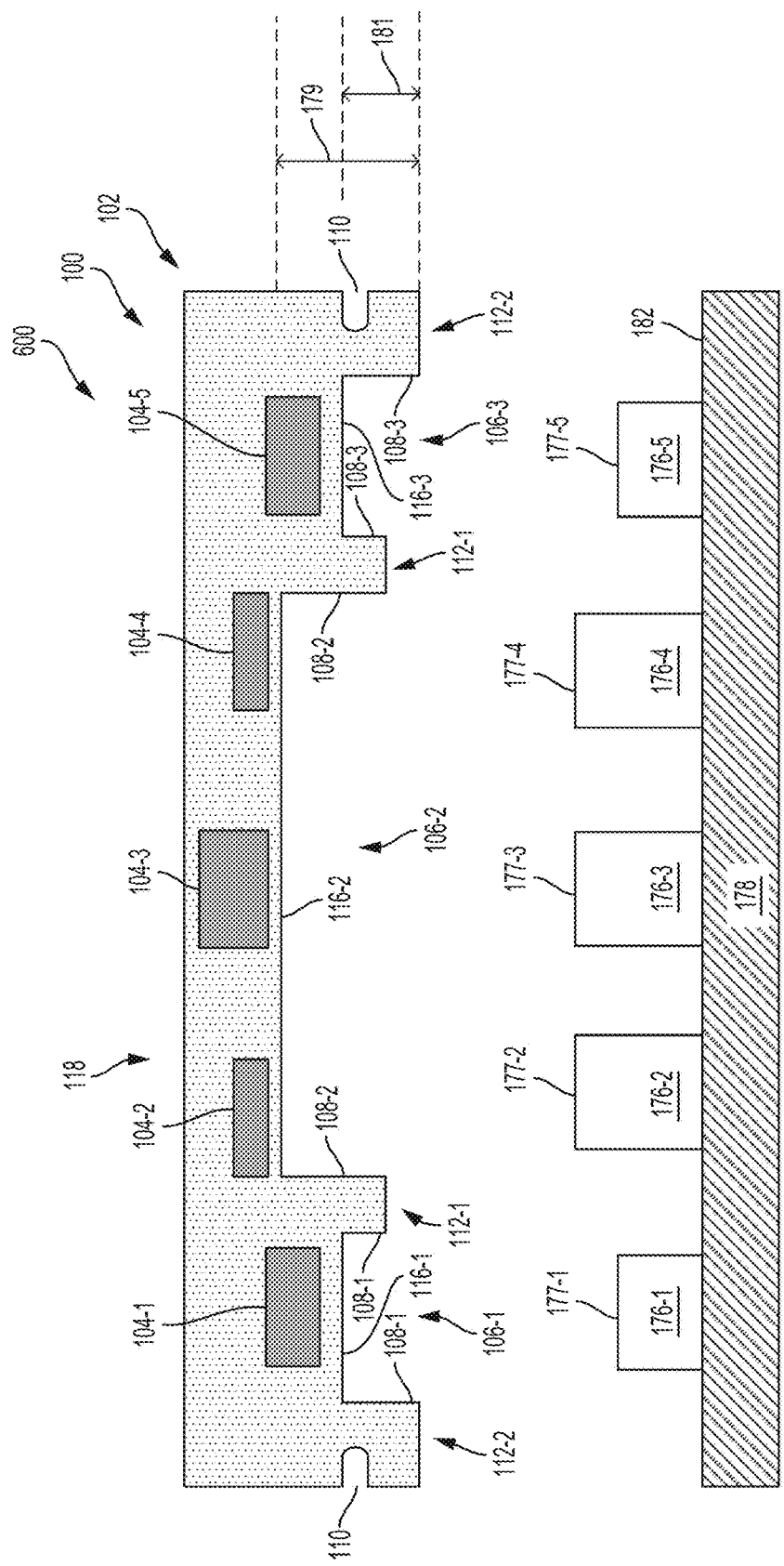
FIG. 6 is an exploded side cross-sectional view of another example heat spreader positioned above multiple integrated circuit (IC) packages in a computing device, in accordance with various embodiments.

As illustrated in FIG. 6, the frame 102 of the heat spreader 100 may provide the top outer surface 118 of the heat spreader 100. In other words, none of the preforms 104 may be exposed on the top outer surface 118. Also, the frame 102 of the heat spreader 100 of FIG. 6 may provide the recess bottom outer surface 116, and thus the preform 104 may not be exposed on the recess bottom outer surface 116 for each of the recesses 106. In other embodiments of the heat spreader 100 including multiple preforms 104, some or none of the preforms 104 may be exposed at the top outer surface 118, the side outer surface 190, and/or the recess bottom outer surface 116. In other embodiments, some or none of the preforms 104 may be covered at the top outer surface 118, the side outer surface 190, and/or the recess bottom outer surface 116 by, for example, a coating material (e.g., as discussed above with reference to FIG. 1).

As noted above, FIG. 6 is an exploded side cross-sectional view of an example heat spreader 100 positioned above multiple IC packages 176 in a computing device 600. The IC packages 176 are shown in FIG. 6 as mounted to a circuit board 178; during use, the projection 112-2 of the heat spreader 100 may be brought into contact with the circuit board 178 such that the IC package 176-1 is disposed in the recess 106-1; the IC packages 176-2, 176-3, and 176-4 are disposed in the recess 106-2; and the IC package 176-5 is disposed in the recess 106-3. The projection 112-2 may be secured to the circuit board 178 using an adhesive or a mechanical fastener, for example.

The IC packages 176 may be in thermal contact with the recess bottom outer surfaces 116 of their respective recesses 106; this may include, for example, having the surfaces 177 of the IC packages 176 in direct physical contact with the recess bottom outer surfaces 116 and/or having a thermally conductive material or materials directly in contact with the surfaces 177 of the IC packages 176 and with the recess bottom outer surfaces 116. For example, a thermally conductive material may be disposed between the surface 177 and the recess bottom outer surface 116. Examples of such a thermally conductive material may include a thermal interface material (TIM) (e.g., a TIM paste) or a thermally conductive epoxy (which may be a fluid when applied and may harden upon curing, as known in the art).

In the embodiment of the heat spreader 100 illustrated in FIG. 6, each of the preforms 104 corresponds to an IC package 176, as shown. This need not be the case. In some embodiments, a single preform 104 may "span" multiple IC packages 176, and/or multiple preforms 104 may "cover" a single IC package 176. Different ones of the preforms 104 may have different dimensions (e.g., thickness) and may be formed of different materials (e.g., isotropic materials and/or anisotropic materials). In particular, any one of the preforms 104 in a multi-preform heat spreader 100 may take the form of any of the embodiments of the preforms 104 disclosed herein.

In some embodiments of the heat spreaders 100 disclosed herein, the sidewalls 108 of a recess 106 may also be in thermal contact with one or more IC packages 176 disposed in the recess 106. In such embodiments, the recess 106 may "hug" an IC package 176 disposed therein and provide more surface contact for thermal transfer.

Figure 18:
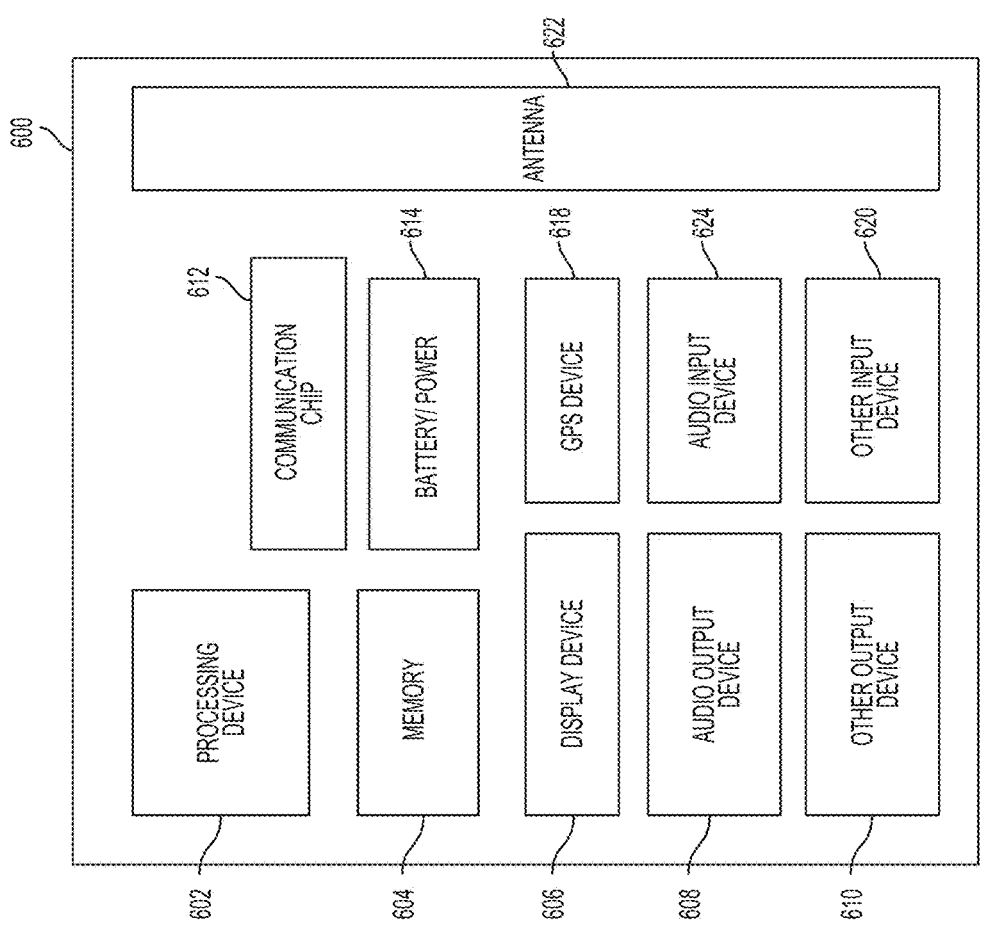
FIG. 18 is a block diagram of an example computing device that may include a heat spreader in accordance with the teachings of the present disclosure.

The IC packages 176 disposed in the recesses 106 of the heat spreaders 100 disclosed herein may include circuitry for performing any computing task. For example, an IC package 176 may include processing circuitry (e.g., a server processor, a digital signal processor, a central processing unit, a graphics processing unit, etc.), memory device circuitry, sensor circuitry, wireless or wired communication circuitry, or any other suitable circuitry. FIG. 18 (discussed below) illustrates an example of a computing device 600 which may include one or more of the heat spreaders 100 to thermally manage one or more of its components; any suitable ones of the components of the computing device 600 may be included in one or more IC packages 176 thermally managed by one or more heat spreaders 100.

The heat spreaders 100 disclosed herein may be formed using any suitable manufacturing techniques. For example, FIGS. 7-10 illustrate various stages in the manufacture of the heat spreader 100 of FIG. 1, in accordance with various embodiments. While FIGS. 7-10 illustrate particular methods for manufacturing the heat spreader 100 of FIG. 1, any manufacturing techniques that can be used to form a heat spreader 100, in accordance with the present disclosure, may be used.

FIG. 7 depicts an assembly 700 subsequent to providing a preform 104 in a cavity 152 of a mold 150. The mold 150 may include mold projections 164 on which the preform 104 rests. In some embodiments (e.g., when the preform 104 is to be enclosed in the frame 102 and not exposed at the recess bottom outer surface 116 of the heat spreader 100), the mold 150 may not include the mold projections 164, and instead, the preform 104 may be supported in the cavity 152 by solid pieces of the metal material that will be used to make the frame 102. These pieces of metal material may be melted and/or otherwise absorbed into the metal material when the frame 102 is cast (e.g., as discussed below with reference to FIG. 9), but may support the preform 104 and maintain the standoff between the preform 104 and the mold 150 until the bulk of the metal material is introduced into the cavity 152 (via an inlet 154). In some embodiments, the preform 104 may be supported in the cavity 152 by solid pieces of a material different from the metal material that will be used to make the frame 102; these solid pieces of material may remain in the frame 102 after casting. Providing a pre-sintered preform 104 to the mold 150 may be less expensive than pouring powdered material (e.g., powdered boron nitride) during the molding process (discussed below), and the pre-sintered preform 104 can be sized and shaped as desired in advance with high precision.

FIG. 8 depicts an assembly 800 subsequent to providing a metal material 156 to the cavity 152 of the assembly 700 to form the frame 102. The metal material 156 may be provided via the inlet 154. In some embodiments, the metal material 156 may be squeeze-cast in the mold 150. In other embodiments, the metal material 156 may be rheocast in the mold 150. In some embodiments, the casting temperatures required to properly cast the material in the mold 150 may be between approximately 400° C. and approximately 700° C. When the preform 104 is formed of porous boron nitride, the metal material 156 may at least partially fill the pores of the preform 104, creating good mechanical bonding between the metal material 156 of the frame 102 and the preform 104. When the preform 104 is formed of dense boron nitride (e.g., with relatively few pores), the metal material 156 may principally bond to the preform 104 at the direct interface between the two.

FIG. 9 depicts an assembly 900 subsequent to de-molding the cast part of the assembly 800. The assembly 900 may have substantially the form of the heat spreader 100 of FIG. 1, but may include an inlet projection 158 resulting from residual metal material 156 in the inlet 154 of the mold 150 (FIG. 8).

FIG. 10 depicts an assembly 1000 subsequent to removing the inlet projection 158 (e.g., with a saw or other suitable tool) and forming the side pockets 110 (e.g., by drilling) in the assembly 900 to form the heat spreader 100. In some embodiments, the side pockets 110 may be formed during the casting process by having an appropriately shaped mold, rather than forming the side pockets 110 after the heat spreader 100 is removed from the mold. The assembly 1000 also includes pocket inserts 160 mated with the side pockets 110 of the heat spreader 100; these pocket inserts 160 may be part of a fixture for holding the heat spreader 100 in place (and/or transporting the heat spreader 100) during further processing operations to finish the heat spreader 100. Examples of further processing operations that may be performed on the heat spreader 100 include polishing the top outer surface 118 (e.g., with a high-speed drill bit) and/or the recess bottom outer surface 116, laser-marking the heat spreader 100 (e.g., on the top outer surface 118 with indicia of the computing device 600 that the heat spreader 100 will be included in), applying any desired coatings to the heat spreader 100 (e.g., to cover the exposed portions of the preform 104 in the recess bottom outer surface 116), or any other desired processing operations.

Figure 11:
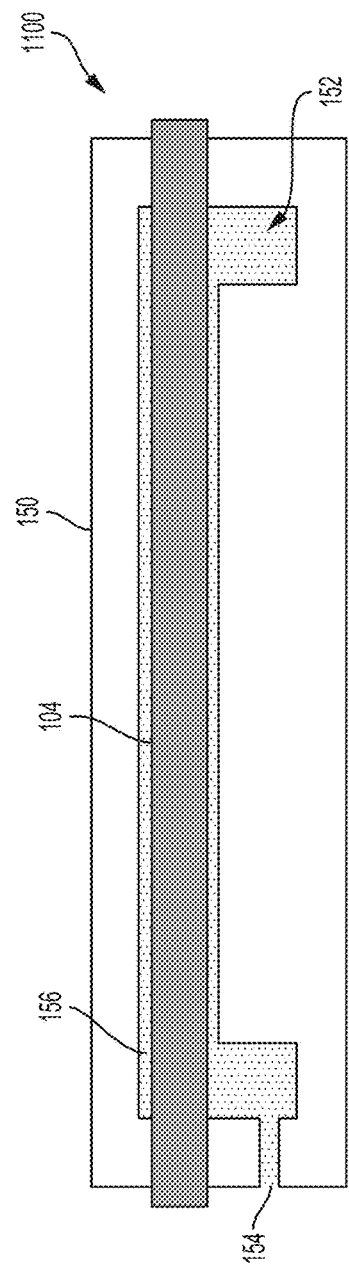
FIGS. 11-13 illustrate various stages in the manufacture of the example heat spreader of FIG. 4, in accordance with various embodiments.
Figure 12:
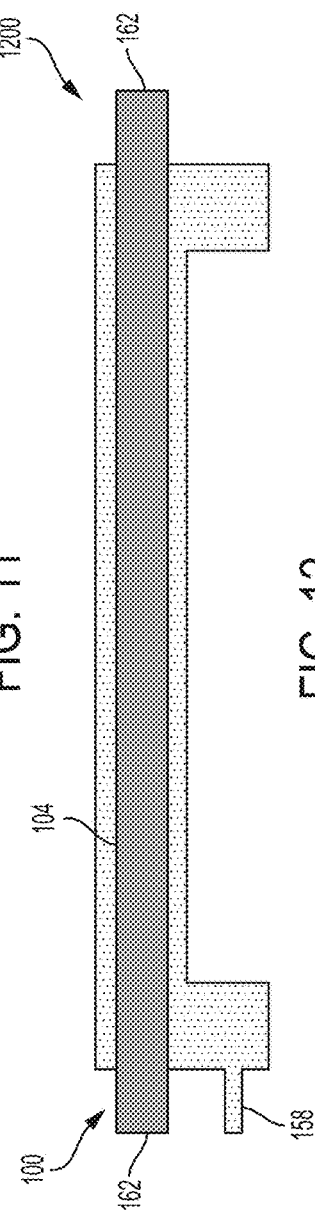
Figure 13:
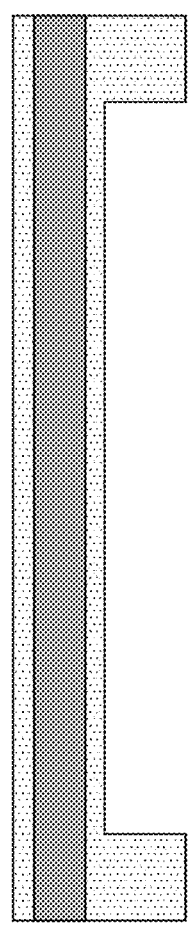

FIGS. 11-13 illustrate various stages in the manufacture of the example heat spreader of FIG. 4, in accordance with various embodiments. While FIGS. 11-13 illustrate a particular method for manufacturing the heat spreader 100 of FIG. 4, any manufacturing techniques that can be used to form a heat spreader 100, in accordance with the present disclosure, may be used.

FIG. 11 depicts an assembly 1100 subsequent to providing a metal material 156 to a cavity 152 of a mold 150 to form the frame 102, wherein a preform 104 is disposed in the mold 150 at least partially in the cavity 152. As shown in FIG. 11, the preform 104 may extend beyond the mold 150 so that the spacing between the top and bottom halves of the mold 150 is controlled by the thickness of the preform 104. The metal material 156 may be provided via the inlet 154. In some embodiments, the metal material 156 may be squeeze-cast in the mold 150. In other embodiments, the metal material 156 may be rheocast in the mold 150.

FIG. 12 depicts an assembly 1200 subsequent to de-molding the cast part of the assembly 1100. The assembly 1200 may have substantially the form of the heat spreader 100 of FIG. 4, but may include an inlet projection 158 resulting from residual metal material 156 in the inlet 154 of the mold 150 and may also include preform projections 162 of the preform 104 extending beyond the frame 102.

FIG. 13 depicts the heat spreader 100 of FIG. 4, subsequent to removing the inlet projection 158 and the preform projections 162 (e.g., with a saw or other suitable tool) of the assembly 1200. The heat spreader 100 of FIG. 13 may be secured in a fixture using any suitable technique and may be further processed to finish the heat spreader 100 (e.g., any of the processing operations discussed above with reference to FIG. 10).

Figure 14:
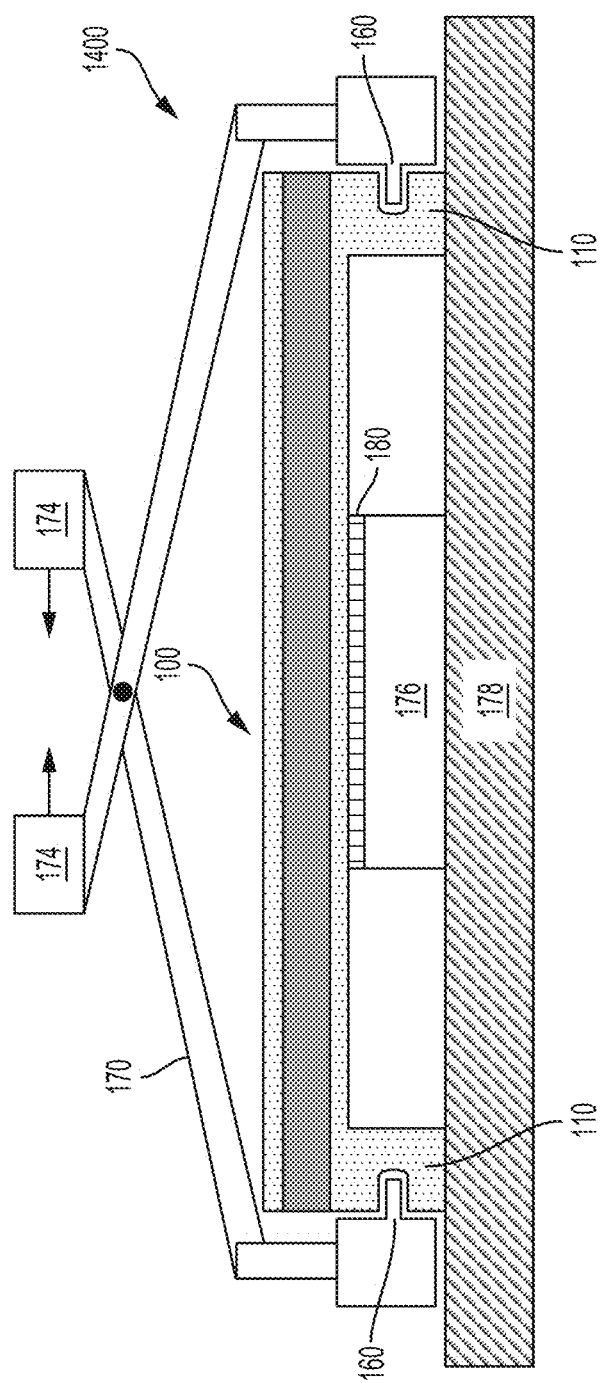
FIG. 14 illustrates an example heat spreader grasped by pocket inserts of a tool, in accordance with various embodiments.

As discussed above, side pockets 110 included in the heat spreader 100 may be used to hold the heat spreader 100 in place during further processing operations and/or to move the heat spreader 100 during assembly. FIG. 14 illustrates an arrangement 1400 in which an example heat spreader 100 (having a form substantially similar to the heat spreader 100 of FIG. 4, but with side pockets 110) is grasped by pocket inserts 160 of a tool 170, in accordance with various embodiments. The tool 170 illustrated in FIG. 14 has the form of a set of pinchers; as the handles 174 of the tool 170 are brought together, the pocket inserts 160 may be moved into the side pockets 110 to grasp the heat spreader 100. The pocket inserts 160 may be translated to move the heat spreader 100 horizontally and/or vertically. In particular, the pocket inserts 160 may aid in moving the heat spreader 100 into position relative to an IC package 176, as shown in FIG. 14. In some embodiments, the heat spreader 100 may be in contact with the circuit board 178 on which the IC package 176 is mounted (e.g., as discussed above with reference to FIG. 6). The heat spreader 100 may be in thermal contact with the IC package 176 via a thermally conductive material 180, as illustrated in FIG. 14; in other embodiments, the heat spreader 100 may be in direct physical contact with the IC package 176. Once the heat spreader 100 is properly positioned relative to the IC package 176 (e.g., by bringing the heat spreader 100 into contact with the thermally conductive material 180), the heat spreader 100 may be released from the pocket inserts 160 and the tool 170.

If the heat spreader 100 is to be "desocketed" from the circuit board 178, the tool 170 may be positioned around the heat spreader 100 and the pocket inserts 160 may be inserted into the side pockets 110 to re-grasp the heat spreader 100. The pocket inserts 160 may then be translated to lift the heat spreader 100 away from the IC package 176.

FIG. 16 is a flow diagram of a method 1600 of manufacturing a heat spreader, in accordance with various embodiments. While the operations of the method 1600 are arranged in a particular order in FIG. 16 and illustrated once each, in various embodiments, one or more of the operations may be repeated (e.g., when the heat spreader includes multiple preforms).

At 1602, a preform may be provided in a cavity of a mold. For example, as discussed above with reference to FIGS. 7 and 11, a preform 104 may be provided in a cavity 152 of a mold 150. The preform of 1602 may be formed in accordance with any of the embodiments of the preform 104 disclosed herein. For example, the preform 104 may be formed of pre-sintered boron nitride (e.g., cubic or hexagonal), synthetic diamond, or any other suitable material. In some embodiments, the preform 104 may be provided in the cavity of the mold at 1602 by placing the preform directly on top of a lower half of the mold, while in other embodiments, the preform 104 may be provided in the cavity of the mold at 1602 positioning the preform on top of one or more pieces of the metal material of 1604 (discussed below) disposed in the cavity of the mold (e.g., as discussed above with reference to FIG. 7).

After providing the preform in the cavity of the mold at 1602, a heat spreader may be formed at 1604 by squeeze-casting or rheocasting a metal material in the cavity of the mold to form a frame of the metal material. The preform may be secured in the frame and may have a thermal conductivity higher than a thermal conductivity of the metal material. The cavity may be shaped to provide a recess to the heat spreader, and the recess may have at least one sidewall formed by the frame. For example, as discussed above with reference to FIGS. 1, 4, 8, and 11, heat spreader 100 may be formed by squeeze-casting or rheocasting a metal material 156 and the cavity 152 of the mold 150 to form the frame 102 of the metal material 156. The preform 104 may be secured in the frame 102 and may have a thermal conductivity higher than the thermal conductivity of the metal material 156. The cavity 152 may be shaped to provide a recess 106 to the heat spreader 100, and the recess 106 may have at least one sidewall 108 formed by the frame 102. The metal materials of 1602 take the form of any of the metal materials for the frame 102 disclosed herein. For example, in some embodiments, the metal material at 1602 may be a zinc alloy or an aluminum alloy.

At 1606, the heat spreader may be removed from the cavity of the mold. For example, as discussed above with reference to FIGS. 9 and 12, the heat spreader 100 may be removed from the cavity 152 of the mold 150. In some embodiments, further processing operations may follow 1606, such as cutting a portion of the preform that extends away from the frame (e.g., as discussed above with reference to FIG. 12), polishing a surface of the heat spreader, forming side pockets in the heat spreader, and/or laser-marking a surface of the heat spreader.

FIG. 17 is a flow diagram of a method 1700 of positioning a heat spreader relative to an IC package, in accordance with various embodiments. While the operations of the method 1700 are arranged in a particular order in FIG. 17 and illustrated once each, in various embodiments, one or more of the operations may be repeated (e.g., when the heat spreader is to be positioned and moved multiple times).

At 1702, a heat spreader may be grasped by inserting pocket inserts of a tool into side pockets disposed on opposite sides of the heat spreader. The heat spreader may include a frame formed of a metal material that is a zinc alloy or an aluminum alloy, a preform secured in the frame and having a thermal conductivity higher than a thermal conductivity of the metal material, and a recess having at least one sidewall formed by the frame. The metal material may have an equiaxed grain structure. For example, the heat spreader 100 of FIGS. 1 and 14 may be grasped by inserting pocket inserts 160 of the tool 170 into the side pockets 110. The heat spreader 100 may include a frame 102 formed of a metal material that is a zinc alloy or aluminum alloy, a preform 104 secured in the frame 102 and having a thermal conductivity higher than a thermal conductivity of the metal material, and a recess 106 having at least one sidewall 108 formed by the frame 102. The metal material of the heat spreader 100 of FIGS. 1 and 14 may have an equiaxed grain structure (e.g., as discussed above with reference to FIG. 1).

After grasping the heat spreader at 1702, the pocket inserts may be translated at 1704 to position the heat spreader relative to the IC package. For example, as illustrated in FIG. 14, the pocket inserts 160 may be translated by the tool 170 to position the heat spreader 100 relative to the IC package 176 (e.g., in thermal contact with the IC package 176, as discussed above). In some embodiments, the method 1700 may also include applying a thermally conductive material to a surface of the IC package, and translating the pocket inserts to position the heat spreader relative to the IC package at 1704 may include bringing the heat spreader into contact with the thermally conductive material.

After positioning the heat spreader at 1704, the heat spreader may be released from the pocket inserts at 1706. For example, the pocket inserts 160 illustrated in FIG. 14 may release the heat spreader 100 when the handles 174 are moved away from each other. In some embodiments, the method 1700 may further include, after releasing the heat spreader from the pocket inserts at 1706, re-grasping the heat spreader by inserting the pocket inserts into the side pockets and, after re-grasping the heat spreader, translating the pocket inserts to lift the heat spreader away from the IC package (e.g., to "desocket" the heat spreader).

FIG. 18 is a block diagram of an example computing device 600 that may include any of the embodiments of the heat spreader 100 disclosed herein. A number of components are illustrated in FIG. 18 as included in the computing device 600, but any one or more of these components may be omitted or duplicated, as suitable for the application.

Additionally, in various embodiments, the computing device 600 may not include one or more of the components illustrated in FIG. 18, but the computing device 600 may include interface circuitry for coupling to the one or more components. For example, the computing device 600 may not include a display device 606, but may include display device interface circuitry (e.g., a connector and driver circuitry) to which a display device 606 may be coupled. In another set of examples, the computing device 600 may not include an audio input device 624 or an audio output device 608, but may include audio input or output device interface circuitry (e.g., connectors and supporting circuitry) to which an audio input device 624 or audio output device 608 may be coupled. Any one or more of the components of the computing device 600 may be included in one or more IC packages that may be in thermal contact with any of the heat spreaders 100 disclosed herein.

The computing device 600 may include a processing device 602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 602 may include one or more digital signal processors (DSPs), application-specific integrated circuits (ASICs), central processing units (CPUs), graphics processing units (GPUs), cryptoprocessors, server processors, or any other suitable processing devices. The computing device 600 may include a memory 604, which may itself include one or more memory devices such as volatile memory (e.g., dynamic random access memory (DRAM)), non-volatile memory (e.g., read-only memory (ROM)), flash memory, solid state memory, and/or a hard drive.

In some embodiments, the computing device 600 may include a communication chip 612 (e.g., one or more communication chips). For example, the communication chip 612 may be configured for managing wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 612 may operate in accordance with a Global System for Mobile communication (GSM), General Packet Radio Service (GPRS), Universal Mobile Telecommunications System (UMTS), High Speed Packet Access (HSPA), Evolved HSPA (E-HSPA), or LTE network. The communication chip 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 612 may operate in accordance with other wireless protocols in other embodiments. The computing device 600 may include an antenna 622 to facilitate wireless communications and/or to receive other wireless communications (such as AM or FM radio transmissions).

In some embodiments, the communication chip 612 may manage wired communications, such as electrical, optical, or any other suitable communication protocols (e.g., the Ethernet). As noted above, the communication chip 612 may include multiple communication chips. For instance, a first communication chip 612 may be dedicated to shorter-range wireless communications such as Wi-Fi or Bluetooth, and a second communication chip 612 may be dedicated to longer-range wireless communications such as GPS, EDGE, GPRS, CDMA, WiMAX, LTE, EV-DO, or others. In some embodiments, a first communication chip 612 may be dedicated to wireless communications, and a second communication chip 612 may be dedicated to wired communications.

The computing device 600 may include battery/power circuitry 614. The battery/power circuitry 614 may include one or more energy storage devices (e.g., batteries or capacitors) and/or circuitry for coupling components of the computing device 600 to an energy source separate from the computing device 600 (e.g., AC line power).

The computing device 600 may include a display device 606 (or corresponding interface circuitry, as discussed above). The display device 606 may include any visual indicators, such as a heads-up display, a computer monitor, a projector, a touchscreen display, a liquid crystal display (LCD), a light-emitting diode display, or a flat panel display, for example.

The computing device 600 may include an audio output device 608 (or corresponding interface circuitry, as discussed above). The audio output device 608 may include any device that generates an audible indicator, such as speakers, headsets, or earbuds, for example.

The computing device 600 may include an audio input device 624 (or corresponding interface circuitry, as discussed above). The audio input device 624 may include any device that generates a signal representative of a sound, such as microphones, microphone arrays, or digital instruments (e.g., instruments having a musical instrument digital interface (MIDI) output).

The computing device 600 may include a global positioning system (GPS) device 618 (or corresponding interface circuitry, as discussed above). The GPS device 618 may be in communication with a satellite-based system and may receive a location of the computing device 600, as known in the art.

The computing device 600 may include another output device 610 (or corresponding interface circuitry, as discussed above). Examples of the other output device 610 may include an audio codec, a video codec, a printer, a wired or wireless transmitter for providing information to other devices, or an additional storage device.

The computing device 600 may include another input device 620 (or corresponding interface circuitry, as discussed above). Examples of the other input device 620 may include an accelerometer, a gyroscope, an image capture device, a keyboard, a cursor control device such as a mouse, a stylus, a touchpad, a bar code reader, a Quick Response (QR) code reader, any sensor, or a radio frequency identification (RFID) reader.

The following paragraphs provide various examples of embodiments disclosed herein.

Example 1 is a heat spreader, including: a frame formed of a metal material, wherein the metal material includes a zinc alloy or an aluminum alloy; a preform secured in the frame, wherein the preform has a thermal conductivity higher than a thermal conductivity of the metal material; and a recess having at least one sidewall formed by the frame; wherein the metal material has an equiaxed grain structure.

Example 2 may include the subject matter of Example 1, and may further specify that the preform includes boron nitride.

Example 3 may include the subject matter of Example 2, and may further specify that the preform includes pre-sintered cubic boron nitride.

Example 4 may include the subject matter of any of Examples 2-3, and may further specify that the preform includes pre-sintered hexagonal boron nitride and has a face that is parallel to a majority orientation of basal planes of the pre-sintered hexagonal boron nitride.

Example 5 may include the subject matter of any of Examples 1-2, and may further specify that the preform includes a material having an anisotropic thermal conductivity, the material has a highest thermal conductivity in a direction, and a face of the preform is parallel to the direction.

Example 6 may include the subject matter of any of Examples 1-5, and may further specify that the preform includes synthetic diamond.

Example 7 may include the subject matter of any of Examples 1-6, and may further include a side pocket formed in the frame.

Example 8 may include the subject matter of Example 7, and may further specify that a sidewall and the side pocket are disposed on opposite faces of a projection of the frame.

Example 9 may include the subject matter of any of Examples 1-8, and may further specify that the preform is enclosed within the frame.

Example 10 may include the subject matter of any of Examples 1-9, and may further specify that the preform is a first preform and the heat spreader further includes a second preform secured in the frame.

Example 11 may include the subject matter of any of Examples 1-10, and may further specify that the recess is a first recess, and the heat spreader further includes a second recess having at least one sidewall formed by the frame, wherein the second recess is adjacent to the first recess.

Example 12 may include the subject matter of Example 11, and may further specify that a depth of the first recess is different from a depth of the second recess.

Example 13 is a method of manufacturing a heat spreader, including: providing a preform in a cavity of a mold; after providing the preform in the cavity of the mold, forming the heat spreader by squeeze-casting or rheocasting a metal material in the cavity of the mold to form a frame of the metal material, wherein the preform is secured in the frame, the preform has a thermal conductivity higher than a thermal conductivity of the metal material, the cavity is shaped to provide a recess to the heat spreader, and the recess has at least one sidewall formed by the frame; and removing the heat spreader from the cavity of the mold.

Example 14 may include the subject matter of Example 13, and may further specify that the metal material includes a zinc alloy or an aluminum alloy.

Example 15 may include the subject matter of any of Examples 13-14, and may further specify that the preform includes pre-sintered boron nitride.

Example 16 may include the subject matter of any of Examples 13-15, and may further specify that providing the preform in the cavity of the mold comprises positioning the preform on top of one or more pieces of the metal material disposed in the cavity of the mold.

Example 17 may include the subject matter of any of Example 13-16, and may further include, after removing the heat spreader from the cavity of the mold, cutting a portion of the preform that extends away from the frame.

Example 18 may include the subject matter of any of Examples 13-17, and may further include laser-marking a surface of the heat spreader.

Example 19 is a method of positioning a heat spreader relative to an integrated circuit (IC) package, including: grasping the heat spreader by inserting pocket inserts of a tool into side pockets disposed on opposite sides of the heat spreader, wherein the heat spreader includes a frame formed of a metal material that includes a zinc alloy or an aluminum alloy, a preform secured in the frame and having a thermal conductivity higher than a thermal conductivity of the metal material, and a recess having at least one sidewall formed by the frame, wherein the metal material has an equiaxed grain structure; after grasping the heat spreader, translating the pocket inserts to position the heat spreader relative to the IC package; and after positioning the heat spreader, releasing the heat spreader from the pocket inserts.

Example 20 may include the subject matter of Example 19, and may further include applying a thermally conductive material to a surface of the IC package, wherein translating the pocket inserts to position the heat spreader relative to the IC package comprises bringing the heat spreader into contact with the thermally conductive material.

Example 21 may include the subject matter of any of Examples 19-20, and may further include after releasing the heat spreader from the pocket inserts, re-grasping the heat spreader by inserting the pocket inserts into the side pockets; and after re-grasping the heat spreader, translating the pocket inserts to lift the heat spreader away from the IC package.

Example 22 is a computing device, including: a heat spreader, including a frame formed of a metal material, wherein the metal material includes a zinc alloy or an aluminum alloy, a preform secured in the frame, wherein the preform has a thermal conductivity higher than a thermal conductivity of the metal material, and a recess having at least one sidewall formed by the frame, wherein the metal material has an equiaxed grain structure; and an integrated circuit (IC) package disposed in the recess.

Example 23 may include the subject matter of Example 22, and may further include an epoxy disposed between a surface of the IC package and a surface of the heat spreader.

Example 24 may include the subject matter of any of Examples 22-23, and may further specify that: the recess is a first recess; the heat spreader further comprises a second recess having at least one sidewall formed by the frame, wherein the second recess is adjacent to the first recess; the IC package is a first IC package; and the computing device further comprises a second IC package disposed in the second recess.

Example 25 may include the subject matter of any of Examples 22-24, and may further specify that the IC package includes a server processor.

Example 26 is an apparatus including means for performing any of the methods disclosed herein, including the methods of examples 13-21.

Example 27 is a computing device including any of the heat spreaders disclosed herein, and an integrated circuit (IC) package disposed in a recess of the heat spreader.

What is claimed is:

1. A method of manufacturing a heat spreader, comprising:
   providing a preform in a cavity of a mold, wherein the preform includes boron nitride;
   after providing the preform in the cavity of the mold, forming the heat spreader by casting a metal material in the cavity of the mold to form a frame, wherein the preform is secured in the frame, the preform has a thermal conductivity higher than a thermal conductivity of the metal material, the cavity is shaped to provide a recess to the heat spreader, and the recess has at least one sidewall formed by the frame; and
   removing the heat spreader from the cavity of the mold.

2. The method of claim 1, wherein the metal material includes a zinc alloy or an aluminum alloy.

3. The method of claim 1, wherein the preform includes hexagonal boron nitride and has a face that is parallel to a majority orientation of basal planes of the hexagonal boron nitride.

4. The method of claim 1, wherein the metal material has an equiaxed grain structure.

5. The method of claim 1, wherein providing the preform in the cavity of the mold comprises positioning the preform on top of one or more pieces of the metal material disposed in the cavity of the mold.

6. The method of claim 1, wherein the heat spreader is formed by squeeze-casting or rheocasting the metal material in the cavity of the mold to form the frame.

7. The method of claim 1, wherein the preform is exposed at a top outer surface of the heat spreader.

8. The method of claim 1, further comprising:
   after removing the heat spreader from the cavity of the mold, forming side pockets in the frame.

9. The method of claim 1, wherein the frame includes side pockets when it is removed from the cavity of the mold.

10. The method of claim 1, further comprising:
    after removing the heat spreader from the cavity of the mold, cutting a portion of the preform that extends away from the frame.

11. The method of claim 1, further comprising:
    laser-marking a surface of the heat spreader.

12. The method of claim 1, further comprising:
    after removing the heat spreader from the cavity of the mold, polishing a top outer surface of the heat spreader.

13. The method of claim 1, further comprising:
    after removing the heat spreader from the cavity of the mold, providing a coating on a recess bottom outer surface of the heat spreader.

14. A method of positioning a heat spreader relative to an integrated circuit (IC) package, comprising:
    grasping the heat spreader by inserting pocket inserts of a tool into side pockets disposed on opposite sides of the heat spreader, wherein the heat spreader includes a frame formed of a metal material that includes a zinc alloy or an aluminum alloy, a preform secured in the frame and having a thermal conductivity higher than a thermal conductivity of the metal material, and a recess having at least one sidewall formed by the frame, wherein the metal material has an equiaxed grain structure;
    after grasping the heat spreader, translating the pocket inserts to position the heat spreader relative to the IC package; and
    after positioning the heat spreader, releasing the heat spreader from the pocket inserts.

15. The method of claim 14, further comprising applying a thermally conductive material to a surface of the IC package, wherein translating the pocket inserts to position the heat spreader relative to the IC package comprises bringing the heat spreader into contact with the thermally conductive material.

16. The method of claim 14, further comprising:
    after releasing the heat spreader from the pocket inserts, re-grasping the heat spreader by inserting the pocket inserts into the side pockets; and
    after re-grasping the heat spreader, translating the pocket inserts to lift the heat spreader away from the IC package.

17. The method of claim 14, wherein positioning the heat spreader relative to the IC package includes positioning the heat spreader in direct contact with the IC package.

18. The method of claim 14 wherein the IC package is mounted on a circuit board, and positioning the heat spreader relative to the IC package includes positioning the heat spreader in thermal contact with the circuit board.

19. The method of claim 14, wherein the IC package includes a server processor.

20. A method of manufacturing a heat spreader, comprising:
    providing a preform in a cavity of a mold;
    after providing the preform in the cavity of the mold, forming the heat spreader by casting a metal material in the cavity of the mold to form a frame, wherein the preform is secured in the frame, the preform has a thermal conductivity higher than a thermal conductivity of the metal material, the cavity is shaped to provide a recess to the heat spreader, and the recess has at least one sidewall formed by the frame;
    removing the heat spreader from the cavity of the mold; and
    laser-marking a surface of the heat spreader.

* * * * *